(12) United States Patent
Sohn et al.

(10) Patent No.: US 7,449,949 B2
(45) Date of Patent: Nov. 11, 2008

(54) DATA AMPLIFYING CIRCUIT CONTROLLABLE WITH SWING LEVEL ACCORDING TO OPERATION MODE AND OUTPUT DRIVER INCLUDING THE SAME

(75) Inventors: Young Soo Sohn, Gunpo-si (KR); Jung Hwan Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 240 days.

(21) Appl. No.: 11/322,759

(22) Filed: Dec. 30, 2005

(65) Prior Publication Data
US 2007/0030066 A1 Feb. 8, 2007

(30) Foreign Application Priority Data
Jul. 19, 2005 (KR) .................. 10-2005-0065438

(51) Int. Cl.
*H03F 3/45* (2006.01)
(52) U.S. Cl. .......................... 330/253; 330/261
(58) Field of Classification Search .......... 330/261, 330/253
See application file for complete search history.

(56) References Cited
U.S. PATENT DOCUMENTS
5,381,113 A * 1/1995 Kimura ................. 330/261

7,061,323 B2 * 6/2006 Morgan et al. ............ 330/261

FOREIGN PATENT DOCUMENTS

| JP | 2003-223799 | 8/2003 |
|---|---|---|
| KR | 10-1999-0048151 | 7/1999 |
| KR | 10-1999-0048158 | 7/1999 |
| KR | 10-2000-0028867 | 5/2000 |

\* cited by examiner

*Primary Examiner*—Khanh V Nguyen
(74) *Attorney, Agent, or Firm*—Mills & Onello LLP

(57) ABSTRACT

A data amplifying circuit for an output driver has a swing level that is controllable according to an operation mode. The data amplifying circuit includes a mode responding circuit supplying an additional source current to a source node of an amplifying circuit in response to a mode selection signal. The mode responding circuit controls the supply of the additional source current in accordance with an operation mode. Another data amplifying circuit of a semiconductor device, according to the invention, includes a small-swing amplifier and a full-swing amplifier. The small-swing amplifier causes a swing level of the output signal to be relatively smaller, while the full-swing amplifier causes the output signal swing level be relatively larger. The small-swing and full-swing amplifiers are alternatively enabled in response to the mode selection signal.

4 Claims, 7 Drawing Sheets

DATA AMPLIFYING CIRCUIT CONTROLLABLE WITH SWING LEVEL ACCORDING TO OPERATION MODE AND OUTPUT DRIVER INCLUDING THE SAME

CROSS-REFERENCE TO RELATED APPLICATIONS

This U.S. non-provisional patent application claims priority under 35 U.S.C. § 119 of Korean Patent Application 2005-65438 filed on Jul. 19, 2005, the entire contents of which are hereby incorporated by reference.

BACKGROUND

The present invention is related to semiconductor devices, and, in particular, is related to a data amplifying circuit that senses and amplifies a voltage difference between input signals and an output driver including the same.

Semiconductor devices such as memories usually contain data amplifying circuits. Such data amplifying circuits enable data to be valid to internal circuits, external circuits, or other circuit elements for the semiconductor devices.

On the other hand, data signals provided to other circuit elements or the external circuits have various swing levels required in accordance with operation modes. In a normal mode, a data amplifying circuit that generates an output signal quickly responding to an input signal even with a smaller swing level is needed. But, a test mode is required of an output signal oscillating in a larger swing level even with slowly responding to an input signal. For instance, in a direct access mode that directly accesses a memory cell array and verifies data values stored therein, an output signal from a data amplifying circuit is required to have a large swing level.

FIG. 1 is a circuit diagram of a conventional data amplifying circuit 10. In the data amplifying circuit 10 of FIG. 1, NMOS transistors 11 and 13 sense and amplify a voltage difference between first and second input signals VIN1 and VIN2. First and second output signals VOUT1 and VOUT1 are regulated in their swing levels by resistors R11 and R12 and a current source 15. Usually, the swing levels of the output signals from the data amplifying circuit 10 shown in FIG. 1 are established in the range of 200-300 mV on the basis of an operation of the normal mode. Otherwise, in the test mode such as the direct access mode, the output signal needs to have its swing level over 600 mV in order to provide valid data reception for the test equipment.

However, in the data amplifying circuit 10 shown in FIG. 1, a source current flowing into a source node NS0 is restricted by the current source 15. Therefore, it is difficult to provide the output signals of the data amplifying circuit 10 for test equipment with valid conditions during the test mode. There has been used an approach to increase the values of the resistors R11 and R12 in order to enlarge the output swing level. However, that approach also presents a burden in adjusting the values of the embedded resistors R11 and R12, resulting in lost time and increased cost.

SUMMARY OF THE INVENTION

The present invention provides a data amplifying circuit with a controllable swing level in accordance with an operation mode and an output driver including the same.

According to a first aspect, the invention is directed to a data amplifying circuit of a semiconductor device, comprising: a source node; an amplifier connected between a power source voltage and the source node, the amplifier generating an output signal by sensing and amplifying a voltage difference between first and second input signals; a current source supplying a reference source current to the source node, the current source causing the output signal to be operable at a predetermined swing level; and a mode responding circuit supplying an additional source current to the source node in response to a predetermined mode selection signal.

According to another aspect, the invention is directed to a data amplifying circuit of a semiconductor device, comprising: a small-swing amplifier generating an output signal in response to first and second input signals, the small-swing amplifier being driven to cause the output signal to have a relatively small swing level; and a full-swing amplifier generating the output signal in response to first and second input signals, the full-swing amplifier being driven to cause the output signal to have a relatively large swing level. The small-swing and full-swing amplifiers are alternately enabled in response to a predetermined mode selection signal.

According to another aspect, the invention is directed to an output driver of a semiconductor device, comprising: a preamplifier generating first and second preliminary signals in accordance with first and second input signals; and a main amplifier generating an output signal in accordance with the first and second preliminary signals. The main amplifier comprises: a source node; an amplifier connected between the source node and a power source voltage, the amplifier providing the output signal by sensing and amplifying a voltage difference between the first and second preliminary signals; a current source supplying a reference source current to the source node, the current source causing the output signal to be operable at a predetermined swing level; and a mode responding circuit supplying an additional source current to the source node in response to a predetermined mode selection signal.

According to another aspect, the invention is directed to an output driver of a semiconductor device comprising: a preamplifier generating first and second preliminary signals in accordance with first and second input signals; and a main amplifier generating an output signal that swings in accordance with the first and second preliminary signals. The preamplifier comprises: a source node; an amplifier connected between the source node and a power source voltage, the amplifier generating the first and second preliminary signals by sensing and amplifying a voltage difference between the first and second preliminary signals; a current source supplying a reference source current to the source node, the current source causing the first and second preliminary signals to be operable at a predetermined swing level; and a mode responding circuit supplying an additional source current to the source node in response to a predetermined mode selection signal.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principle of the invention.

DETAILED DESCRIPTION OF PREFERRED EMBODIMENTS

Figure 1:
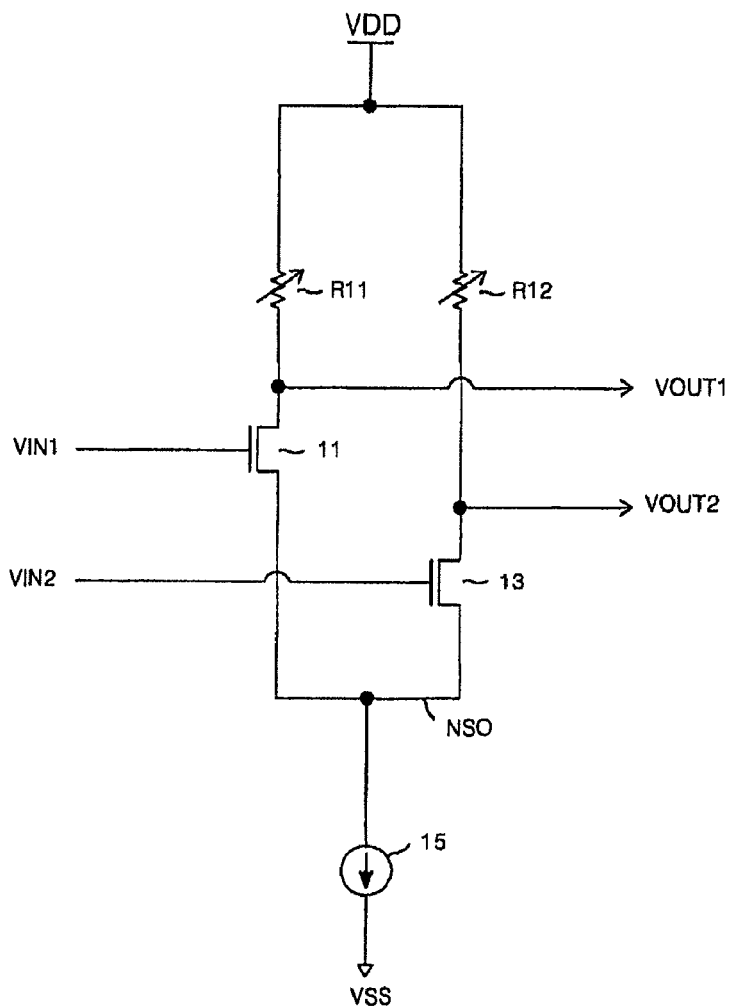
FIG. 1 is a circuit diagram of a conventional data amplifying circuit.
Figure 2:
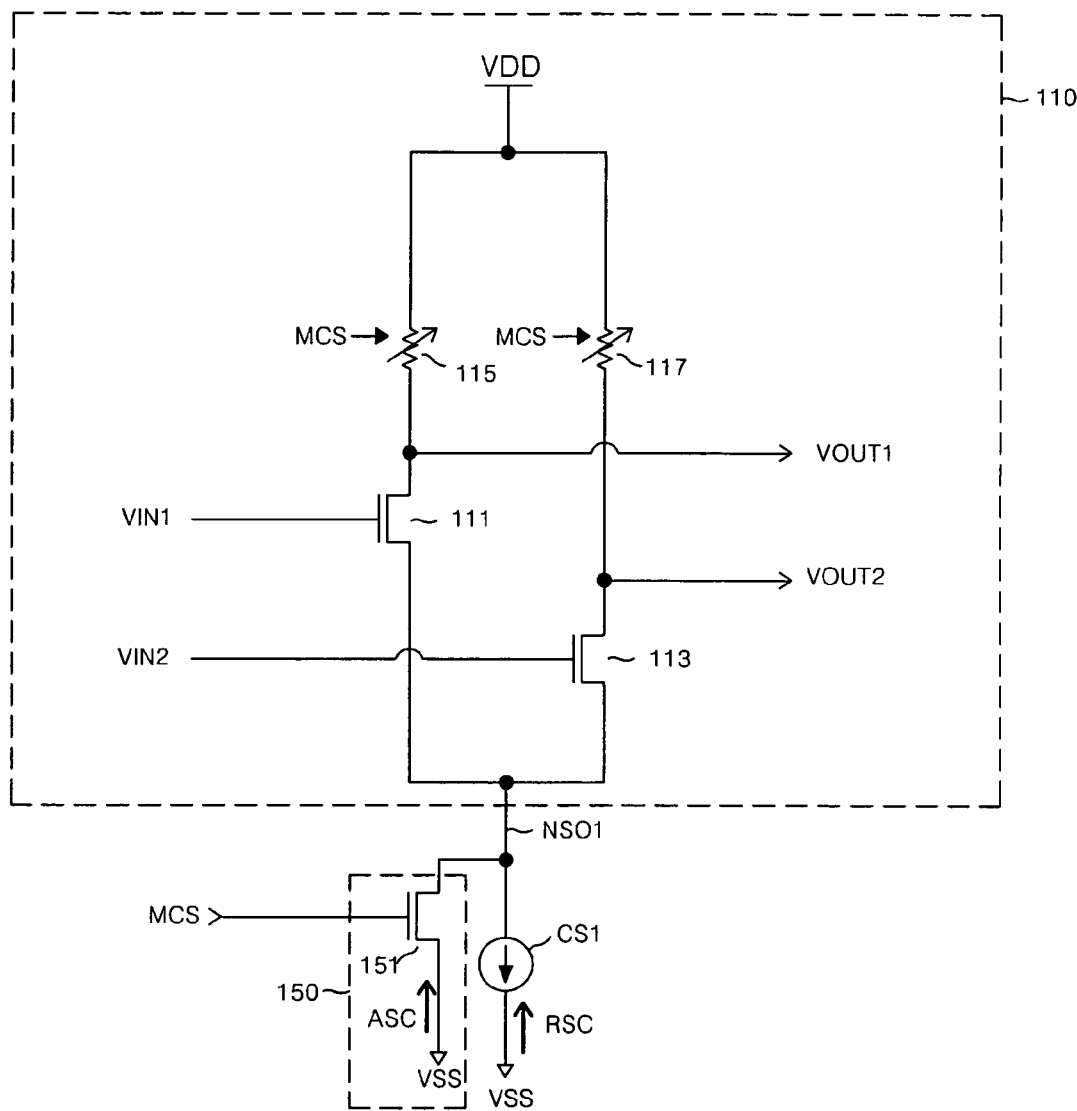
FIG. 2 is a circuit diagram illustrating a data amplifying circuit of a semiconductor device in accordance with an embodiment of the invention.

FIG. 2 is a circuit diagram illustrating a data amplifying circuit 100 of a semiconductor device in accordance with an embodiment of the invention. Referring to FIG. 2, the data amplifying circuit 100 is comprised of a source node NS01, an amplifier 110, a current source CS1, and a mode responding circuit 150.

The amplifier 110 is connected between a power source voltage VDD and the source node NS01. The amplifier 110 senses and amplifies a voltage difference between first and second input signals VIN1 and VIN2, generating first and second output signals VOUT1 and VOUT2.

The current source CS1 supplies a reference source current RSC to the source node NS01 at a predetermined level in order to make the first and second output signals VOUT1 and VOUT2 be operable at a predetermined swing level.

The mode responding circuit 150 supplies an additional source current ASC to the source node NS01 in response to a mode selection signal MCS. Preferably, the mode responding circuit 150 is comprised of an NMOS transistor 151 that is gated by the selection signal MCS and is connected between the source node NS01 and a ground voltage VSS.

When the mode selection signal MCS becomes a high level "H", the NMOS transistor 151 is gated, i.e., turned on. As a result, the source node NS0 is controlled to be the ground voltage VSS, being supplied with the additional source current ASC. Thus, when the mode selection signal MCS is set to "H", swing levels of the first and second output signals VOUT1 and VOUT2 from the amplifier 110 transition to a relatively larger value.

In contrast, when the mode selection signal MCS is set to a low level "L", the NMOS transistor 151 is turned on and then the additional source current ASC is interrupted to flow into the source node NS01. As a result, when the mode selection signal MCS is set on "L", the swing levels of the first and second output signals VOUT1 and VOUT2 become relatively smaller.

The amplifier 110 is comprised of first and second responding transistors 111 and 113, and first and second load elements 115 and 117. The first and second responding transistors 111 and 113 are gated by the first and second input signals VIN1 and VIN2. Source terminals of the first and second responding transistors 111 and 113 are electrically connected to the source node NS01 in common.

The first and second load elements 115 and 117 are connected between the power source voltage VDD and the drain terminals of the first and second responding transistors 111 and 113. Preferably, the first and second load elements 115 and 117 are variable resistors responding to the mode selection signal MCS. When the mode selection signal MCS is set to "H", the resistance of the first and second load elements 115 and 117 becomes higher. As a result, the first and second output signals VOUT1 and VOUT2 are driven to make their swing levels increase toward the ground voltage VSS.

In the data amplifying circuit shown in FIG. 2, the additional source current ASC provided from the mode responding circuit 150 controls the swing levels of the first and second output signals VOUT1 and VOUT2. In the normal mode where the mode selection signal MCS is set to "L", the swing levels of the first and second output signals VOUT1 and VOUT2 become relatively smaller. In the test mode, such as the direct access mode, where the mode selection signal MCS is set to "H", the swing levels of the first and second output signals VOUT1 and VOUT2 become relatively larger.

Further, when the first and second load elements 115 and 117 are conductive in variable resistance in response to the mode selection signal MCS, the first and second output signals VOUT1 and VOUT2 are operable in more enlarged gaps with their swing levels in accordance with operational modes.

As a result, the data amplifying circuit 100 of FIG. 2 is controllable with its output swing level according to operational modes, so that it may be effectively operable in both the normal mode and the test mode.

Figure 3:
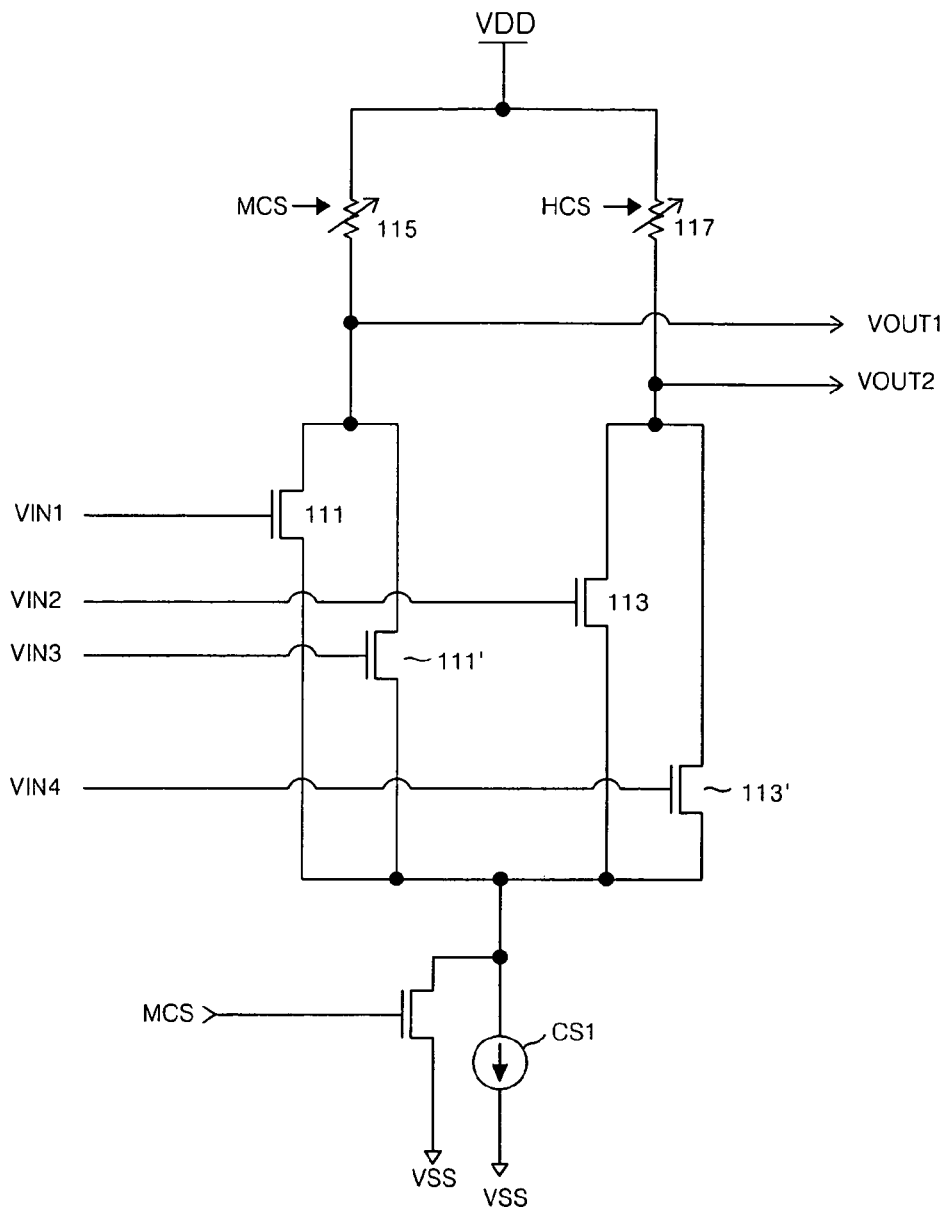
FIG. 3 is a circuit diagram illustrating a modification of the data amplifying circuit shown in FIG. 2.

The invention can also be implemented by the data amplifying circuit 100' shown in FIG. 3, as a modification of the data amplifying circuit 100 of FIG. 2.

The data amplifying circuit of FIG. 3 is similar to the data amplifying circuit 100 of FIG. 2, except that in the embodiment of FIG. 3, the first and second output signals VOUT1 and VOUT2 swing in response to four input signals VIN1, VIN2, VIN3, and VIN4, instead of just the two input signals VIN1 and VIN2 of the embodiment of FIG. 2. In the embodiment shown in FIG. 3, the four input signals VIN1 ~VIN4 are received in the form of a bit stream provided in sequence without overlaps in time between high logic states. Other structures and operations in the data amplifying circuits of FIG. 3 are essentially the same as those of the data amplifying circuit 100 of FIG. 2 and would be understood by one of skill in the art from the description above of the embodiment of FIG. 2. Therefore, description of those structures and operations will not be repeated.

Figure 4:
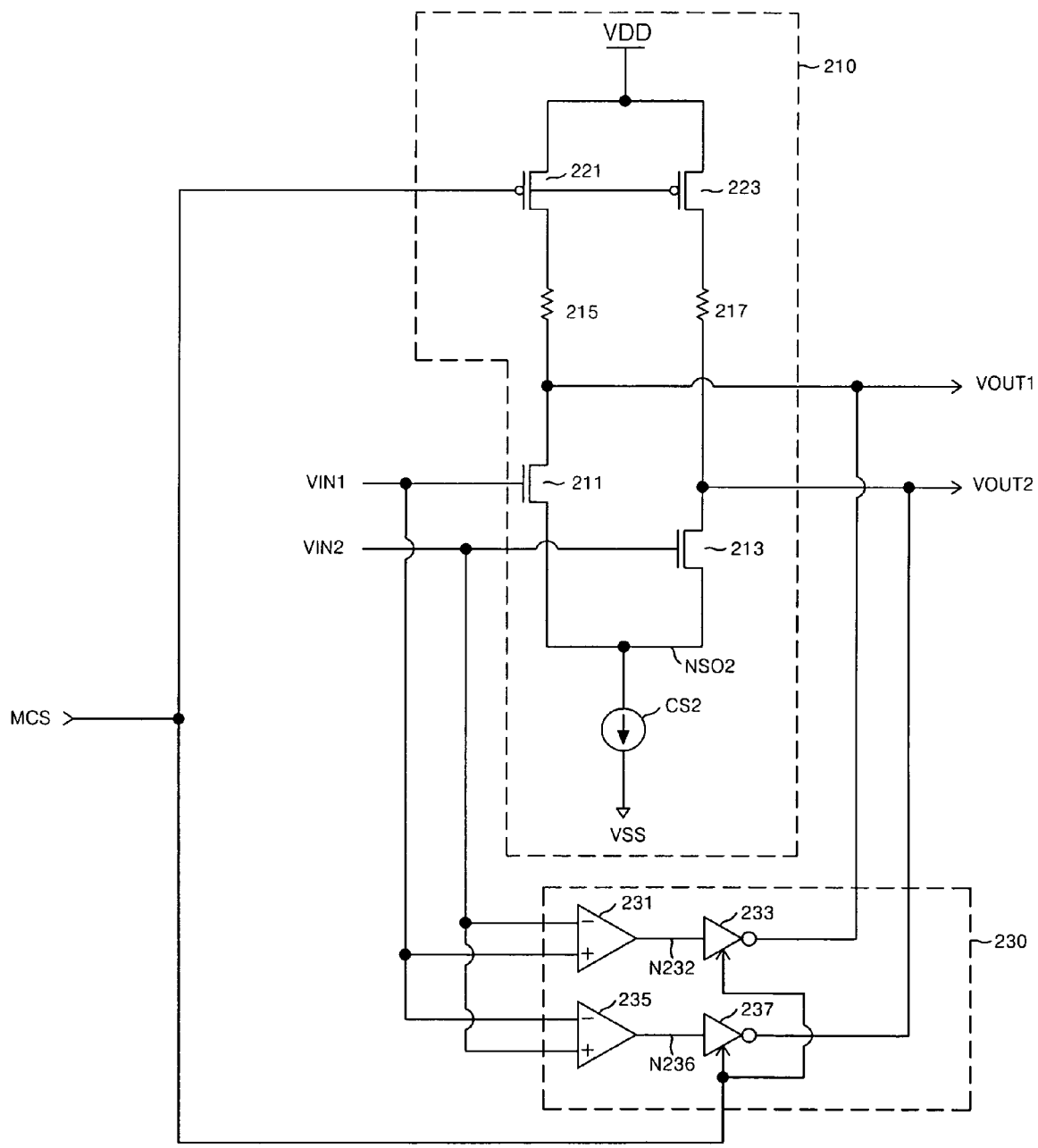
FIG. 4 is a circuit diagram illustrating a data amplifying circuit in accordance with another embodiment of the invention.

FIG. 4 is a circuit diagram illustrating a data amplifying circuit 200 in accordance with another embodiment of the invention. Referring to FIG. 4, the data amplifying circuit 200 is comprised of a small-swing amplifier 210 and a full-swing amplifier 230. The small-swing and full-swing amplifiers, 210 and 230, generate the first and second output signals VOUT1 and VOUT2 in response to the first and second input signals VIN1 and VIN2. The small-swing amplifier 210 is driven to make the first and second output signals VOUT1 and VOUT2 be operable at relatively small swing levels. Otherwise, the full-swing amplifier 230 is driven to make the first and second output signals VOUT1 and VOUT2 be operable at relatively large swing levels.

The small-swing and full-swing amplifiers, 210 and 230, are alternatively enabled in response to the mode selection signal MCS.

The small-swing amplifier 210 is similar to the data amplifying circuit 100, but further includes first and second mode transistors 221 and 223.

The first and second mode transistors, 221 and 223, are connected between the power source voltage VDD and drain terminals of first and second responding transistors 211 and 213, in series with first and second load elements 215 and 217, respectively, as shown. The first and second mode transistors, 221 and 223, are gated in response to the mode selection signal MCS. Preferably, the first and second mode transistors 221 and 223 are PMOS transistors.

Thus, in the test mode where the mode selection mode MCS is set to "H", the first and second mode transistors 211 and 213 are turned off. Although the first and second input signals, VIN1 and VIN2, are applied to gate electrodes of the first and second responding transistors 211 and 213, the small-swing amplifier 210 does not generate the first and second output signals VOUT1 and VOUT2 with validity.

In the normal mode where the mode selection signal is set to "L", the first and second mode transistors 211 and 213 are turned on. The small-swing amplifier 210 generates the first and second output signals VOUT1 and VOUT2 with validity.

As other structural features and operational effects by the small-swing amplifier 210 are similar to those of the data amplifying, circuit 100 of FIG. 2, description of those other structural features and operational effects will not be repeated.

The full-swing amplifier 230 is comprised of a first comparator 231. The first comparator 231 compares the first input signal VIN1 with the second input signal VIN2. An output signal N232 of the first comparator 231 swings in the full voltage range. The output signal N232 of the first comparator 231 is provided as the first output signal VOUT1 through a buffer 233 when the mode selection signal MCS is set to "H".

The full-swing amplifier 230 also includes a second comparator 235. The second comparator 235 also compares the first input signal VIN1 with the second input signal VIN2. An output signal N236 of the second comparator 235 also swings in the full voltage range. However, the second comparator 235 conducts the comparing operation with the first and second input signals VIN1 and VIN2 in the inverse condition to the first comparator 231. That is, in the first comparator 231, the first input signal VIN1 is applied to a positive (+) input terminal while the second input signal VIN2 is applied to a negative (−) input terminal. In the second comparator 235, the first input signal VIN1 is applied to a negative (−) input terminal while the second input signal VIN2 is applied to a positive (+) input terminal.

The output signal N236 of the second comparator 235 is provided as the second output signal VOUT2 through a buffer 237 when the mode selection signal MCS is set to "H".

The full-swing amplifier 230 is disabled during the normal mode when the mode selection signal MCS is set to "L", but enabled during the test mode such as the direct access node when the mode selection signal MCS is set to "H".

The data amplifying circuit 200 of FIG. 3 is controlled with its swing level in accordance with an operation mode. In the normal mode, the small-swing amplifier 210 is enabled while the full-swing amplifier 230 is disabled. Thus, the pair of output signals VOUT1 and VOUT2 generated by the data amplifying circuit 200 of FIG. 3 oscillates in a small swing level.

In the test mode, the small-swing amplifier 210 is disabled while the full-swing amplifier 230 is enabled. Thus, the pair of the output signals VOUT1 and VOUT2 generated by the data amplifying circuit 200 of FIG. 3 oscillates in a large swing level.

As a result, the data amplifying circuit 200 of FIG. 3 is able to control its output swing level in accordance with an operation mode, so that it may be effectively operated in both the normal and test modes.

Figure 5:
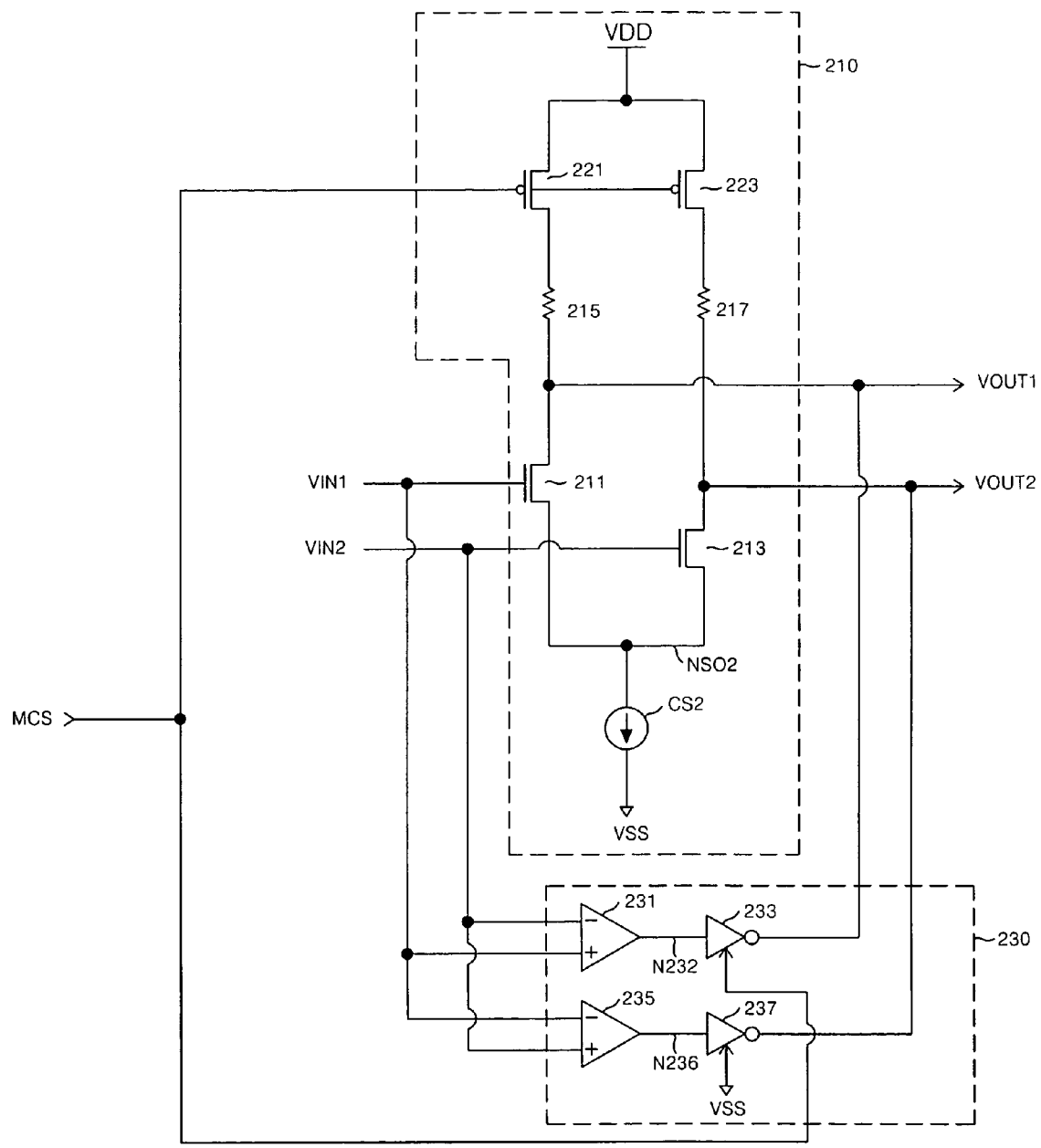
FIG. 5 is a circuit diagram illustrating a modification of the data amplifying circuit shown in FIG. 4.

FIG. 5 illustrates a modified version of the embodiment of FIG. 4 in which only a single output signal VOUT1 is generated by a data amplifying circuit 200' shown in FIG. 5. In the data amplifying circuit 200' of FIG. 5, the buffer 237, which buffer the output signal N236 of the second comparator 235, is held at the ground voltage VSS. Thus, the second output signal VOUT2 is fixed to a unique logic state and only the first output signal VOUT1 is generated with validity.

Figure 6:
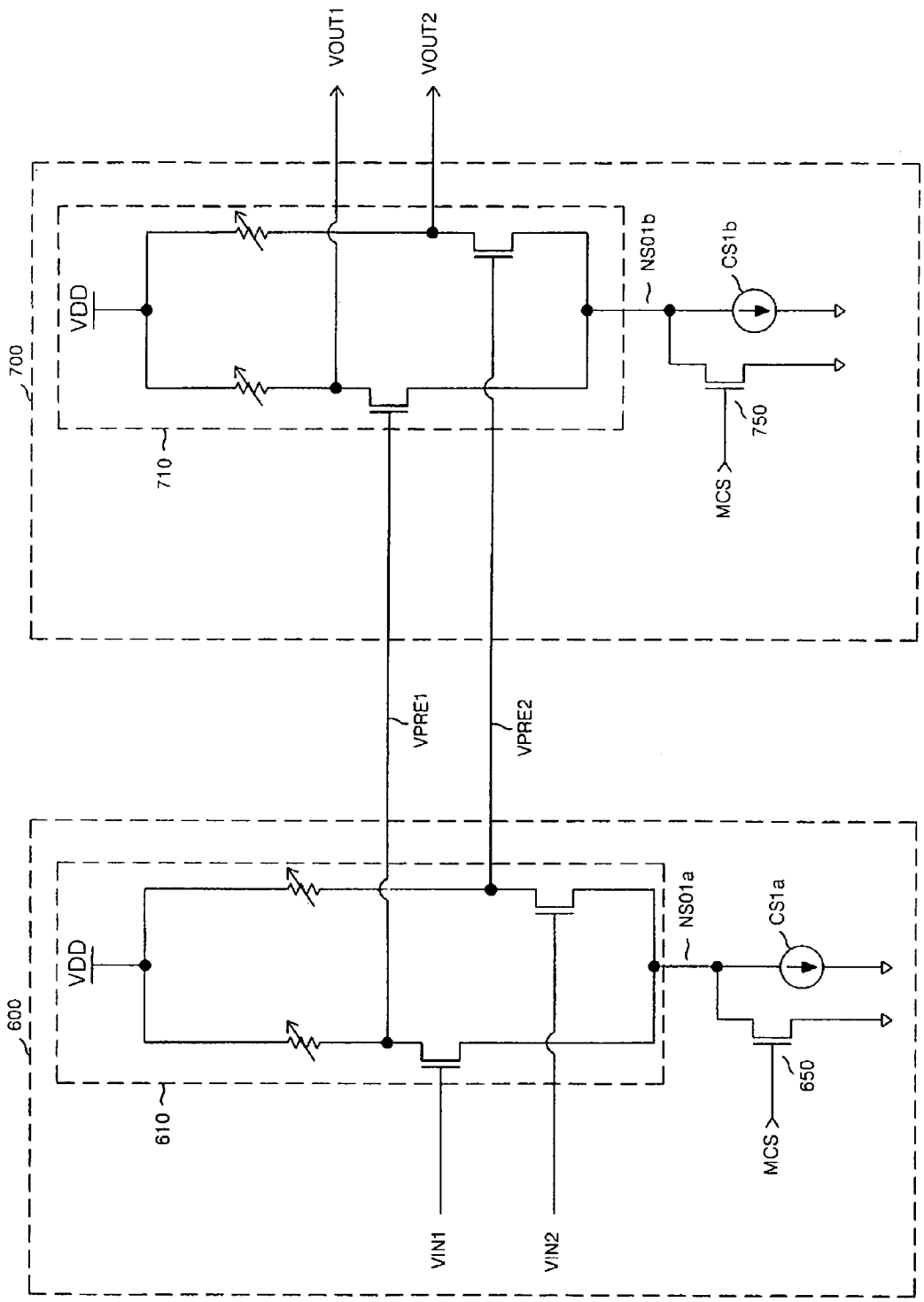
FIG. 6 is a circuit diagram illustrating an output driver in accordance with an embodiment of the invention, employing the data amplifying circuit shown in FIG. 2.

FIG. 6 is a circuit diagram illustrating an output driver in accordance with another embodiment of the invention, employing the data amplifying circuit shown in FIG. 2. Referring to FIG. 6, the output driver is comprised of a pre-amplifier 600 and a main amplifier 700. The pre-amplifier 600 receives the first and second input signals VIN1 and VIN2, and generates first and second preliminary signals VPRE1 and VPRE2. In this case, the first and second preliminary signals, VPRE1 and VPRE2, are obtained by first amplifying a voltage difference between the first and second input signals VIN1 and VIN2. Thereafter, the main amplifier 700 further amplifies the first and second preliminary signals VPRE1 and VPRE2, and then generates the first and second output signals VOUT1 and VOUT2.

The pre-amplifier 600 and the main amplifier 700 of FIG. 6, like the data amplifying circuit 100 shown in FIG. 2, include source nodes NS01a and NS01b, amplifiers 610 and 710, current sources CS1a and CS1b, and mode responding circuits 650 and 750. Operations of the pre-amplifier 600 and the main amplifier 700 will be understood with reference to the description herein of the data amplifying circuit 100 of FIG. 2. Therefore, description of the pre-amplifier 600 and main amplifier 700 will not be repeated.

The output driver of FIG. 6 is properly controlled with its output swing level in accordance with an operation mode while outputting data from a chip to another chip or device.

While the embodiment shown in FIG. 6 is illustrated and described such that the mode responding circuits 650 and 750 are included in the pre-amplifier 600 and the main amplifier 700, the mode responding circuits may alternatively be included in one or both of the pre-amplifier 600 and the main amplifier 700.

Figure 7:
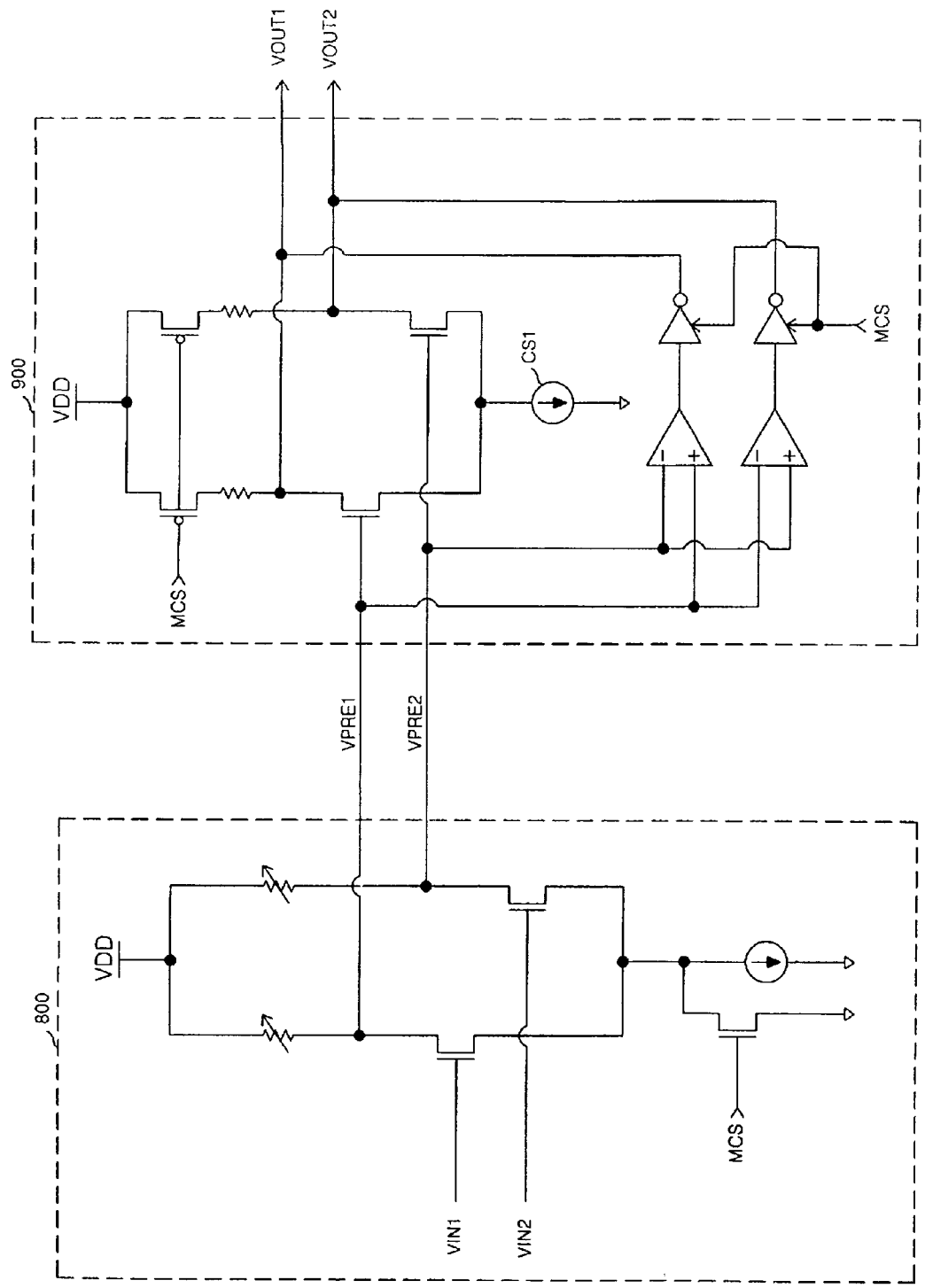
FIG. 7 is a circuit diagram illustrating an output driver in accordance with another embodiment of the invention, employing the data amplifying circuits shown in FIGS. 2 and 3.

FIG. 7 is a circuit diagram illustrating an output driver in accordance with another embodiment of the invention, employing the data amplifying circuits shown in FIGS. 2 and 3.

The output driver of FIG. 7, similar to the output driver shown in FIG. 6, is comprised of a pre-amplifier 800 and a main amplifier 900.

Like the pre-amplifier 600 shown in FIG. 6, the pre-amplifier 800 of FIG. 7 receives the first and second input signals VIN1 and VIN2, and generates the first and second preliminary signals VPRE1 and VPRE2. The main amplifier 900 further amplifies the first and second preliminary signals VPRE1 and VPRE2, and then generates the first and second output signals VOUT1 and VOUT2, similar to the main amplifier 700 shown in FIG. 6.

The main amplifier 900 of FIG. 7 is different from the main amplifier 700 of FIG. 6 in that the main amplifier 900 of FIG. 7 is implemented with the data amplifying circuit of FIG. 3. The output driver of FIG. 7 has its output swing level controlled in accordance with an operation mode, i.e., the normal or test mode.

In summary, the data amplifying circuit for a semiconductor device, according to the first embodiment of the invention, includes the mode responding circuit to supply the additional source current to the source node of the amplifier in response to the mode selection signal. The mode responding circuit regulates the supply of the additional source current in accordance with an operation mode. Thus, the output signals from the data amplifying circuit are controlled with their swing levels dependent on an operation mode.

Further, the data amplifying circuit according to another embodiment of the invention includes the small-swing and full-swing amplifiers. The small-swing amplifier makes the output swing level relatively lower while the full-swing amplifier makes the output swing level relatively higher. The small-swing and full-swing amplifiers are alternatively enabled in response to the mode selection signal. The output signals from the data amplifying circuit by the second embodiment are also controlled with their swing levels in accordance with an operation mode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A data amplifying circuit of a semiconductor device, comprising:
    a source node;
    an amplifier connected between a power source voltage and the source node and comprising first and second load elements, the amplifier generating an output signal by sensing and amplifying a voltage difference between first and second input signals, wherein each of the first and second load elements is a variable resistor responsive to a predetermined mode selection signal;
    a current source supplying a reference source current to the source node, the current source causing the output signal be operable at a predetermined swing level; and
    a mode responding circuit supplying an additional source current to the source node in response to the predetermined mode selection signal.

2. The data amplifying circuit as set forth in claim 1, wherein the mode responding circuit comprises an NMOS transistor that is gated by the mode selection signal and is connected between the source node and a ground voltage.

3. The data amplifying circuit as set forth in claim 1, wherein the amplifier comprises:
    first and second responding transistors gated by the first and second input signals, respectively, and connected to the source node in common through first terminals of the first and second responding transistors
    wherein the first and second load elements are connected between the power source voltage and second terminals of the first and second responding transistors.

4. A data amplifying circuit of a semiconductor device comprising:
    a source node;
    an amplifier connected between a power source voltage and the source node, the amplifier generating an output signal by sensing and amplifying a voltage difference between first and second input signals, wherein the amplifier comprises:
        first and second responding transistors gated by the first and second input signals, respectively, and connected to the source node in common through first terminals of the first and second responding transistors; and
        first and second load elements connected between the power source voltage and second terminals of the first and second responding transistors,
    wherein each of the first and second load elements is a variable resistor responding to the predetermined mode selection signal;
    a current source supplying a reference source current to the source node, the current source causing the output signal be operable at a predetermined swing level; and
    a mode responding circuit supplying an additional source current to the source node in response to a predetermined mode selection signal.

* * * * *